United States Patent [19]

Matsumoto et al.

[11] Patent Number: 4,655,045
[45] Date of Patent: Apr. 7, 1987

[54] CRYOGENIC VESSEL FOR A SUPERCONDUCTING APPARATUS

[75] Inventors: Takahiro Matsumoto; Tetsuo Nishio; Hirofumi Maekawa; Hisashi Oota, all of Ako, Japan

[73] Assignee: Mitsubishi Denki Kabushiki Kaisha, Tokyo, Japan

[21] Appl. No.: 819,856

[22] Filed: Jan. 17, 1986

[30] Foreign Application Priority Data

Jan. 17, 1985 [JP] Japan ............................. 60-4888
Apr. 12, 1985 [JP] Japan ............................. 60-76749
May 14, 1985 [JP] Japan ............................. 60-100542
May 14, 1985 [JP] Japan ............................. 60-100543
Sep. 17, 1985 [JP] Japan ............................. 60-205661

[51] Int. Cl.⁴ ............................................. F17C 1/04
[52] U.S. Cl. ........................................ 62/45; 62/514 R
[58] Field of Search ............................. 62/45, 514 R

[56] References Cited

U.S. PATENT DOCUMENTS

| 3,364,688 | 1/1968 | Matlow et al. | 62/45 |
|---|---|---|---|
| 3,433,028 | 3/1969 | Klee | 62/45 |
| 3,481,149 | 12/1969 | Crane | 62/45 |
| 3,483,709 | 12/1969 | Baicker et al. | 62/45 |
| 3,762,175 | 10/1973 | Jones | 62/45 |
| 4,502,296 | 3/1985 | Ogata et al. | 62/45 |
| 4,516,404 | 5/1985 | Laskaris | 62/45 |
| 4,522,034 | 6/1985 | Laskaris | 62/45 |
| 4,535,596 | 8/1985 | Laskaris | 62/45 |

FOREIGN PATENT DOCUMENTS

| 1501319 | 10/1971 | Fed. Rep. of Germany . |
|---|---|---|
| 44-1510 | 1/1969 | Japan . |
| 49-22735 | 6/1974 | Japan . |
| 59-17550 | 4/1984 | Japan . |

*Primary Examiner*—Ronald C. Capossela
*Attorney, Agent, or Firm*—Leydig, Voit & Mayer

[57] ABSTRACT

A cryogenic vessel for a superconducting apparatus has an inner vessel which houses a freezing mixture and a winding of a superconducting apparatus. The inner vessel is surrounded by a vacuum insulating vessel which thermally insulates the inner vessel. A connecting pipe connects the inside of the inner vessel with the outside of the vacuum insulating vessel. A cylindrical dividing pipe which surrounds the connecting pipe with a radial clearance therebetween extends into the inner vessel and is connected between the inner end of the connecting pipe and the inner vessel. A gas flow passageway is formed between the inner end and the outer end of the connecting pipe, the passageway bordering on the inner or outer surface of the connecting pipe. During normal operation, gas which is formed by the vaporization of a freezing mixture contained inside the inner vessel continually passes along the passageway, absorbing heat from the connecting pipe and reducing the amount of heat which penetrates into the inner vessel by conduction along the connecting pipe. A wiring support pipe for the power supply leads of a cryogenic vessel according to the present invention is a single, rigid pipe which has one of its ends connected to an inner vessel or a vacuum insulating vessel by a flexible tube which absorbs thermal shrinkage.

19 Claims, 17 Drawing Figures

CRYOGENIC VESSEL FOR A SUPERCONDUCTING APPARATUS

BACKGROUND OF THE INVENTION

This invention relates to a cryogenic vessel for a superconducting apparatus, and more particularly but not exclusively, it relates to a cryogenic vessel for cooling the superconducting magnet of a superconducting apparatus such as a nuclear magnetic resonance diagnosis apparatus.

Figure 1:
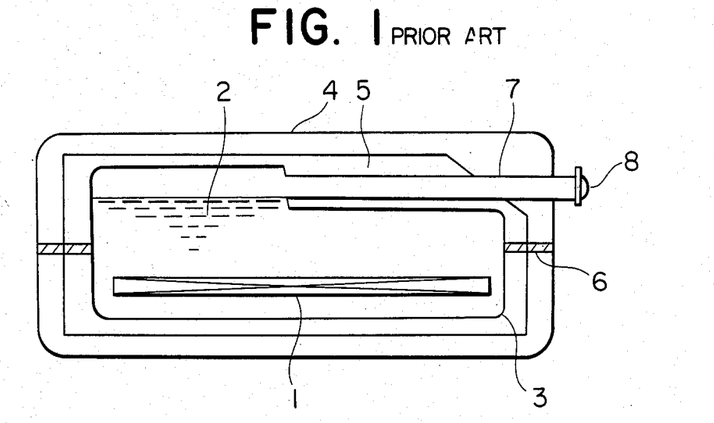
FIG. 1 is a simplified longitudinal cross-sectional view of a conventional cryogenic vessel.
Figure 2:
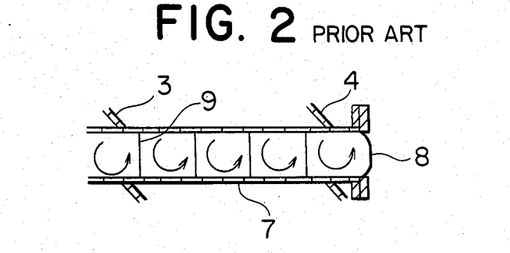
FIG. 2 is a longitudinal cross-sectional view of the inside of the connecting pipe of FIG. 1.

A conventional cryogenic vessel which was disclosed in Japanese Patent Publication No. 59-17550 is illustrated in FIG. 1. In that invention, a cylindrical, substantially horizontal inner vessel 3 which contains a superconducting magnet 1 and a freezing mixture 2 of liquid helium or the like is contained with a vacuum insulating vessel 4 which thermally insulates the inner vessel 3. A number of heat shields 5 (only one of which is shown in the figure) which are at an intermediate temperature are disposed between the inner vessel 3 and the vacuum insulating vessel 4 and serve to insulate the inner vessel 3. The inner vessel 3 is supported by support members 6 whose outer ends are secured to the vacuum insulating vessel 4. The inside of the inner vessel 3 is connected with the outside of the vacuum insulating vessel 4 by a substantially horizontal connecting pipe 7. While the inner end of the connecting pipe 7 opens onto the inside of the inner vessel 3, the outer end is sealed by a rupture-type safety valve 8. The safety valve 8 contains a thin plate which ruptures when the pressure inside the connecting pipe 7 exceeds a certain value. As shown in FIG. 2, a plurality of disk-shaped dividing plates 9 made of a material with a low thermal conductivity are disposed at intervals on the inside of the connecting pipe 7. These dividing plates 9 divide the connecting pipe 7 into a plurality of small compartments and thereby reduce convection by gas contained within the connecting pipe 7. Each of these dividing plates 9 is designed so as to rupture or open at or below the pressure at which the safety valve 8 ruptures so that when the gas pressure within the inner vessel 3 exceeds a certain value, the gas can be discharged through the connecting pipe 7.

Although the dividing plates 9 are effective in reducing the penetration of heat into the inner vessel 3 due to convection by gas within the connecting pipe 7, they can not prevent the penetration of heat by conduction along the walls of the connecting pipe 7, and a large amount of heat can enter the inner vessel 3 in this manner. Accordingly, the illustrated cryogenic vessel is not entirely satisfactory with respect to its thermal insulation.

Another problem with the illustrated conventional apparatus is that the dimensions can not be reduced without increasing the penetration of heat along the connecting pipe 7. Namely, since the connecting pipe 7 connects to the outer surface of the inner vessel 3, if the external dimensions of the entire vessel are to be decreased by decreasing the size of the spaces between the inner vessel 3, the heat shield 5, and the vacuum insulating vessel as far as possible while still enabling assembly, the length of the connecting pipe 7 is inevitably decreased, causing an increase in the conduction of heat along the connecting pipe 7 and increasing the consumption of the cryogenic mixture 2.

Figure 3:
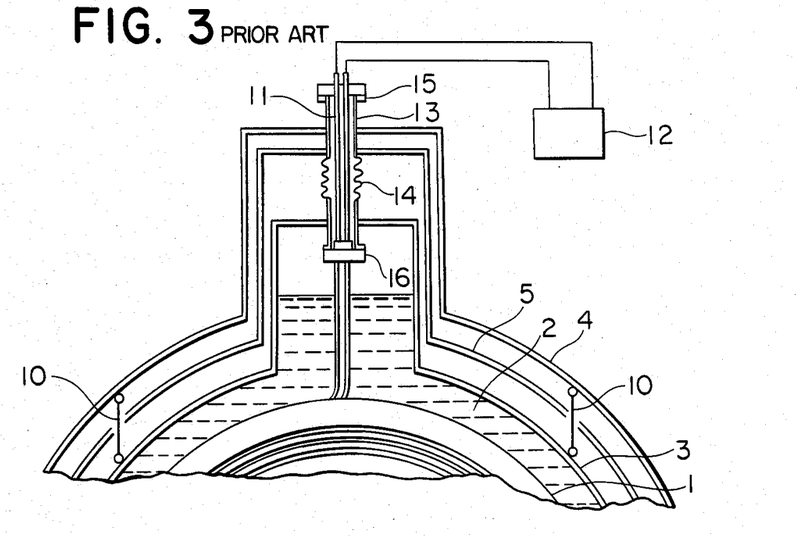
FIG. 3 is a transverse cross-sectional view of a portion of another conventional cryogenic vessel.

FIG. 3 illustrates a portion of another conventional cryogenic vessel as disclosed in Japanese Patent Publication No. 54-53359. As shown in this figure, a superconducting magnet 1 is electrically connected to a power supply 12 by power supply leads 11 which extend from the outside of a vacuum insulating vessel 4 to the inside of an inner vessel 3 filled with a cryogenic mixture 2 such as liquid helium. The power supply leads 11 are supported by a wiring support pipe 13 whose outer end is secured to the vacuum insulating vessel 4 and whose inner end is secured to the inner vessel 3. The wiring suppport pipe 13 is divided into an upper and lower portion which are connected with one another by a flexible tube 14. The flexible tube 14 enables the upper and lower portion to move with respect to one another when thermal shrinkage occurs due to the cooling of the various parts of the vessel, thereby preventing thermal stresses from developing in the wiring support pipe 13. The upper ends of the power supply leads 11 are secured to the wiring support pipe 13 by a flange 15 mounted on its upper end, and the lower ends of the leads 11 are secured to the wiring support pipe 13 by a connector 16 which is mounted on the inner end thereof and which electrically connects the power supply leads 11 to the superconducting magnet 1. As in the vessel of FIG. 1, the inner vessel 3 is supported by the vacuum insulating vessel 4 through support members 10.

While the flexible tube 14 is effective to prevent thermal stresses from developing in the wiring support tube 13, it results in thermal stresses arising in the power supply leads 11, since the change in dimensions of the power supply leads 11 due to thermal shrinkage is much less than that of the wiring support pipe 13 and the flexible tube 14. For this reason, it is very difficult to reliably connect the power supply leads 11 to the connector 16.

SUMMARY OF THE INVENTION

It is an object of the present invention to provide a cryogenic vessel for a superconducting apparatus in which the penetration of heat by thermal conduction along a connecting pipe is decreased.

It is another object of the present invention to provide a cryogenic vessel for a superconducting apparatus which is more compact than a conventional cryogenic vessel having a connecting pipe of the same length.

It is yet another object of the present invention to provide a cryogenic vessel for a superconducting apparatus in which thermal stresses do not develop in its power supply leads.

It is a further object of the present invention to provide a cryogenic vessel for a superconducting apparatus in which the penetration of heat by thermal conduction along an injection pipe for a cryogenic mixture can be reduced.

In the present invention, a reduction in the size of a cryogenic vessel is achieved by the provision of a cylindrical dividing pipe which extends into an inner vessel and connects the inner end of a connecting pipe to the inner vessel. The connecting pipe extends into the inner vessel through the dividing pipe which surrounds a portion of the connecting pipe, with a radial gap between the inner surface of the dividing pipe and the outer surface of the connecting pipe. The amount by which the connecting pipe extends from the inner vessel can be reduced by the amount by which the connecting pipe extends into the inner vessel, allowing a reduction in external dimensions without reducing the overall length of the connecting pipe compared with that of a conventional cryogenic vessel.

The present invention may also include means for cooling the connecting pipe by causing gas to continually flow along the surface of the connecting pipe. A gas flow passageway is formed between the inner end of the connecting pipe and the outer end, the passageway bordering on the inner or outer surface of the connecting pipe. During normal operation, gas which is formed by the vaporization of a cryogenic mixture contained inside the inner vessel continually flows along the passageway, absorbing heat from the connecting pipe and reducing the amount of heat which penetrates into the inner vessel by conduction along the connecting pipe.

A wiring support pipe for the power supply leads of a cryogenic vessel according to the present invention is a single, rigid pipe which has one of its ends connected to an inner vessel or a vacuum insulating vessel by a flexible tube which absorbs thermal shrinkage. Since the wiring support pipe is a single, rigid pipe, it undergoes thermal shrinkage by about the same amount as the power supply leads which it supports, and thermal stresses do not develop in the power supply leads.

BRIEF DESCRIPTION OF THE DRAWINGS

In all of the figures, the same reference numerals indicate the same or corresponding parts.

DESCRIPTION OF THE PREFERRED EMBODIMENTS

A number of preferred embodiments of a cryogenic vessel in accordance with the present invention will now be described while referring to FIGS. 4 through 17 of the accompanying drawings.

Figure 4:
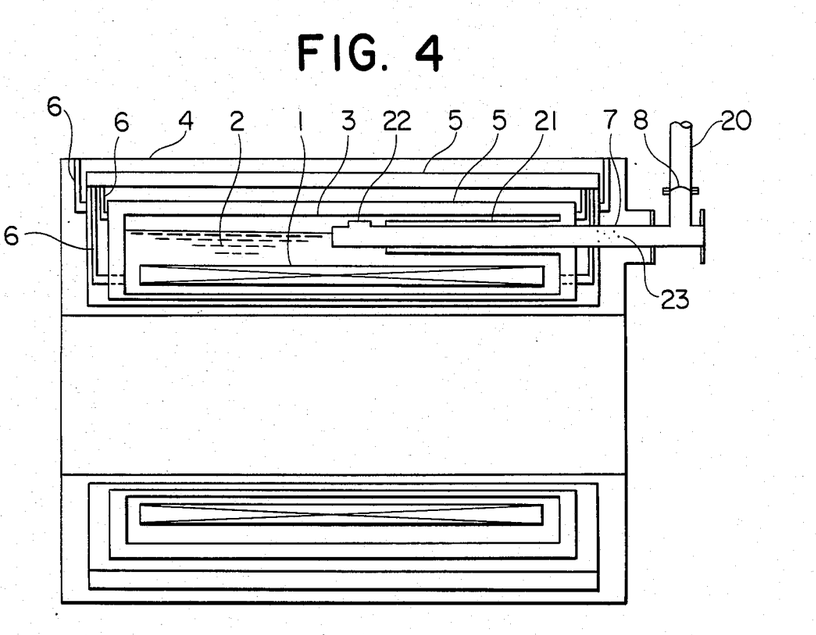
FIG. 4 is a longitudinal cross-sectional view of a first embodiment of a cryogenic vessel according to the present invention.
Figure 5:
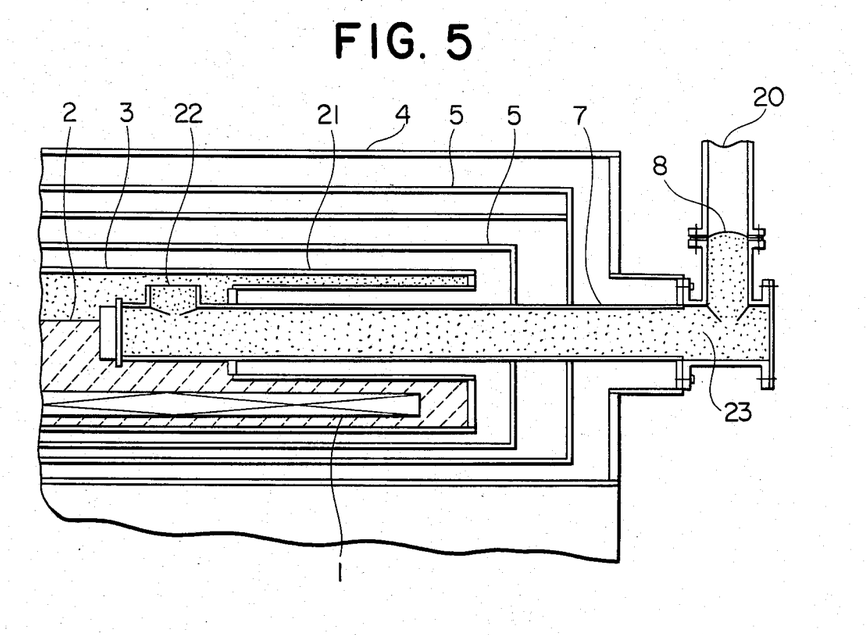
FIG. 5 is a longitudinal cross-sectional view showing the upper right portion of the embodiment of FIG. 4 in greater detail.

FIGS. 4 and 5 illustrate a first embodiment of the present invnetion. FIG. 4 being a longitudinal cross-sectional view of the entire vessel and FIG. 5 being an enlarged view of the upper right portion of FIG. 4. The overall structure of this cryogenic vessel is similar to that of the conventional cryogenic vessel of FIG. 1. A cylindrically and substantially horizontal inner vessel 3 has contained therein a superconducting magnet 1 and a cryogenic mixture 2 such as liquid helium which cools the superconducting magnet 1 to cryogenic temperatures. The inner vessel 3 is surrounded by a vacuum insulating space between the inner vessel 3 and the outer vessel 4 which thermally insulates it. A number of heat shields 5 are provided in the space between the outer vessel 4 and the inner vessel 3 in order to help insulate the latter. The inner vessel 3 is supported by support member 6 which are connected between it and the vessel 4. A cylindrically and substantially horizontal connecting pipe 7 connects the inside of the inner vessel 3 to the outside of the vessel 4. On its outer end, the connecting pipe 7 has an upwards-extending branch pipe 20 in which is installed a rupture-type safety valve 8 which has a thin plate which ruptures when the pressure within the connecting pipe 7 exceeds a certain level. Near its inner end, the connecting pipe 7 has an upwards-extending inlet 22 whose upper end lies above the surface of the cryogenic mixture 2 in the inner vessel 3.

In the conventional apparatus of FIG. 1, the connecting pipe 7 is connected to the outer surface of the inner vessel 3, but in the present invention, it is connected near its inner end to the inner end of a dividing pipe 21 which surrounds a portion of the connecting pipe 7. The outer end of the dividing pipe 21 is connected to the outer surface of the inner vessel 3, and the inner end extends into the inner vessel 3 and is secured to the outer surface of the connecting pipe 7. The diameter of the dividing pipe 21 is large enough so that there is a radial clearance between its inner surface and the outer surface of the connecting pipe 7.

With this construction, the overall dimensions of the vessel can be smaller than those of the conventional apparatus of FIG. 1 with no decrease in the length of the connecting pipe 7. Namely, be decreasing the amount by which the connecting pipe 7 extends outside of the inner vessel 3 and increasing the amount by which it extends into the inner vessel 3, the external dimensions can be reduced with no decrease in the length of the connecting pipe 7 and therefore with no increase in heat penetration by conduction along the connecting pipe 7. On the other hand, a cryogenic vessel according to the present invention having the same outer dimensions as a conventional cryogenic vessel can have a longer connecting pipe 7 since a portion of the connecting pipe 7 extends into the inner vessel 3. As the amount of heat which penetrates by conduction is inversely proportional to the length of the connecting pipe 7, a cryogenic vessel according to this invention is superior with respect to reducing thermal conduction.

Figure 6:
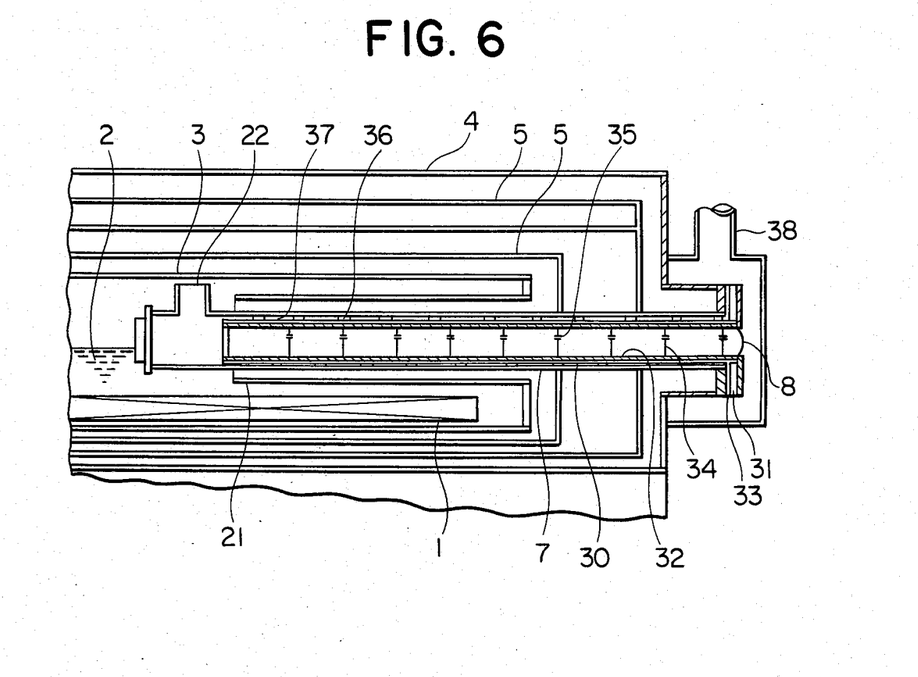
FIG. 6 is a longitudinal cross-sectional view of a portion of a second embodiment of a cryogenic vessel.
Figure 7:
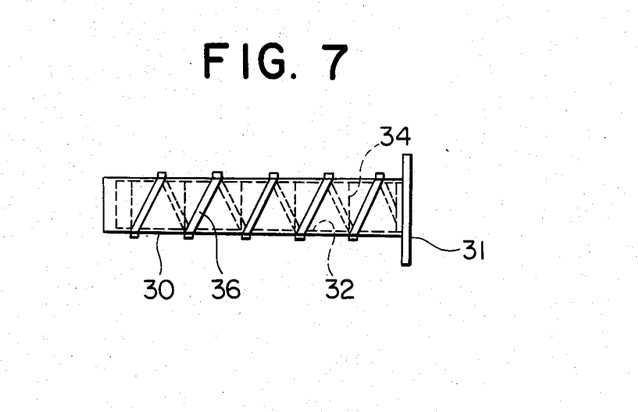
FIG. 7 is a side view of the inner pipe of the embodiment of FIG. 6.

FIGS. 6 and 7 illustrate the essential features of a second embodiment of the present invention. Except for the portions shown in FIGS. 6 and 7, the overall structure is identical to that of the embodiment of FIG. 4. As in the first embodiment, a connecting pipe 7 extends from the inside of an inner vessel 3 to the outside of a vacuum insulating vessel 4, with the inner end of the connecting pipe 7 being connected to the inner end of a dividing pipe 21 which extends from the outer surface of the inner vessel 3 into its interior.

A cylindrical inner pipe 30 is disposed within the connecting pipe 7 and extends from the outer end of the connecting pipe 7 to near the inlet 22 of the connecting pipe 7. A radial clearance is left between the outer surface of the inner pipe 30 and the inner surface of the connecting pipe 7. The inner end of the inner pipe 30 is open so that vaporized cryogenic mixture 2 from within the inner vessel 3 can flow into it. The outer end of the inner pipe 30 is sealed by a conventional rupture-type safety valve 8 which ruptures when the pressure within the inner pipe 30 exceeds a certain level. A plurality of disk-shaped dividing plates 34 are disposed at intervals inside the inner pipe 30 so as to divide it into a plurality of small compartments, thereby reducing the penetration of heat along the connecting pipe 7 by convection by gas. Each of the dividing plates 34 has a pressure-equalizing hole 35 formed therein which maintains an equal pressure on both sides of each dividing plate 34. The dividing plates 34 are designed to rupture, or else have radial slits formed therein which permit them to elastically deform and open without being destroyed when there is a sudden increase in pressure in the inner vessel 3. The dividing plates 34 are held in place by one or more spacer tubes 32 which fit inside the inner pipe 30 and maintain the proper spacing between adjacent dividing plates 34.

In the space between the outer surface of the inner pipe 30 and the inner surface of the connecting pipe 7 is disposed a spiral member 36 which projects from the inner pipe 30 and contacts the outer surface of the inner pipe 30 and the inner surface of the connecting pipe 7 along its entire length. The shape of the spiral member 36 is shown more clearly in FIG. 7, which is a side view of the inner pipe 30. The spiral member 36 forms a spiral gas flow passageway 37 extending for the entire length of the inner pipe 36 between it and the inner surface of the connecting pipe 7. The inner pipe 30 has a flange 31 formed on its outer end, and a gas outlet 33 is formed between this flange 31 and the outer surface of the vacuum insulating vessel 4. Gas from the inner vessel 3 can flow into the inlet 22 of the connecting pipe 7, along the gas flow passageway 37, out of the outlet 33 at the outer end of the connecting pipe 7, and into a discharge pipe 38 which covers the outer end of the connecting pipe 7. The inner pipe 30 and the spiral member 36 together comprise means for cooling the connecting pipe 7.

When the superconducting magnet 1 is in a superconducting state, a small amount of the cryogenic mixture 2 is continually caused to evaporate by a minute quantity of heat which manages to penetrate into the inner vessel, thus producing a gas. In the present invention, this gas flows into the inlet 22 of the connecting pipe 7, flows along the outer surface of the connecting pipe 7 through the gas flow passageway 37, flows out of the connecting pipe 7 through the outlet 33, and is discharged into the atmosphere through the discharge pipe 38. As this extremely cold gas (if the freezing mixture 2 is liquid helium, the temperature of the gas as it enters the inlet 22 is approximately 4.2 K) flows along the surface of the connecting pipe 7, it absorbs heat which is conducted along the connecting pipe 7 from the high-temperature end of the connecting pipe 7, thereby preventing this heat from penetrating into the inner vessel 3. Thus, the inner vessel 3 is effectively insulated against the penetration of heat by conduction along the connecting pipe 7, which was a problem of conventional cryogenic vessels. At the same time, the dividing plates 34 provided inside the inner pipe 30 reduce the amount of heat which penetrates by convection.

If for some reason the superconducting magent 1 should go non-critical and begin to conduct resistively, there will be a sudden increase in temperature within the inner vessel 3. A large amount of the cryogenic mixture will rapidly vaporize, increasing the gas pressure within the inner vessel 3. In this event, when the gas pressure reaches a certain level, the gas will rupture or elastically deform the dividing plates 34 so as to cause them to open, rupture the safety valve 8 disposed at the outer end of the inner pipe 30, and be discharged through the discharge pipe 38, thereby reducing the pressure within the inner vessel 3 and preventing its damage due to an abnormal rise in pressure.

The holes 35 formed in the dividing plates enable the safety valve 8 to determine the pressure at which the dividing plates 34 open, and they prevent the rupture of the dividing plates 34 when the cryogenic mixture 2 in the inner vessel 3 is being replenished.

In this embodiment, the gas flow passageway 37 is in the form of a spiral. This lengthens the passageway 37 and enables the gas to better cool the connecting pipe 7 than if it extended straight from the inner to the outer end of the connecting pipe 7.

Although the safety valve 8 is shown as being installed on the outer end of the inner pipe 30, it is possible to instead install it on the inner end of the inner pipe 30 so long as it does not interfere with the flow of gas into the gas flow passageway 37.

Figure 8:
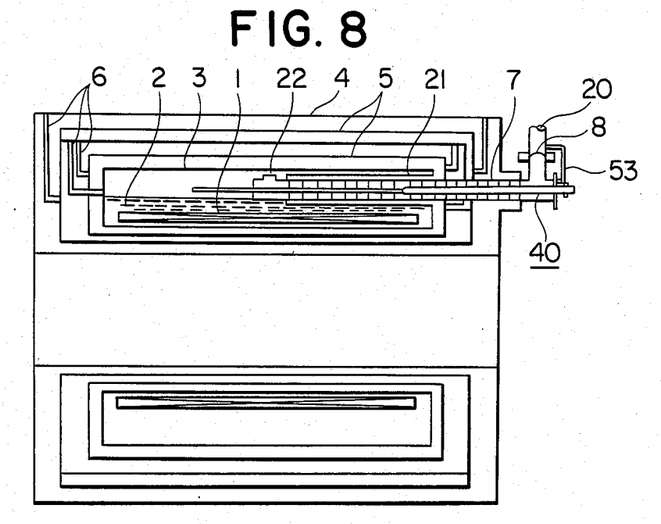
FIG. 8 is a longitudinal cross-sectional view of a third embodiment of a cryogenic vessel.
Figure 9:
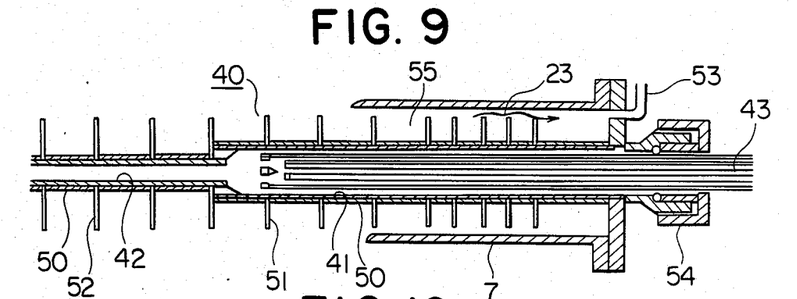
FIG. 9 is an enlarged longitudinal cross-sectional view of the outer end of the connecting pipe of the embodiment of FIG. 8.

FIGS. 8 and 9 illustrate a third embodiment of a cryogenic vessel according to the present invention. The basic structure is similar to that of the previous embodiments, and in the same manner as in those embodiment, a dividing pipe 21 extends from the outer surface of an inner vessel 3 into the inner vessel 3 and a connecting pipe 7 which has its inner end connected to the inner end of the dividing pipe 21 extends from the inside of the inner vessel 3 to the outside of a vacuum insulating vessel 4. This embodiment is significantly different from the previous two in that an injection pipe 40 for injecting freezing mixture 2 into the inner vessel 3 is disposed inside the connecting pipe 7. The structure of this injection pipe 40 is shown in detail in FIG. 9. The injection pipe has a first inner pipe 41 connected at its inner end to a coaxially-disposed second inner pipe 42 having a smaller diameter than the first inner pipe 41. The outer end of the first inner pipe 41 penetrates the outer end of the connecting pipe 7, and the inner end of the second inner pipe 42 extends past the inner end of the connecting pipe 7 and into the inner vessel 3. A plurality of disk-shaped first dividing plates 51 are disposed on the outside of the first inner pipe 41, and a plurality of disk-shaped second dividing plates 52 are disposed on the outside of the second inner pipe 42. The dividing plates 51 and 52 are held in place by spacer tubes 50 which fit over the outer surfaces of the first and second inner pipes 41 and 42 and maintain the proper spacing between the adjacent dividing plates 51 and 52. Like the dividing plates 34 in the previous embodiment, these dividing plates 51 and 52 are designed to rupture or elastically deform when the pressure inside the connecting pipe 7 exceeds a certain value, and when not ruptured or otherwise deformed, they serve to decrease convection by gas within the connecting pipe 7 by dividing the inside of the connecting pipe 7 into a large number of small compartments. A small space is left between the outer surface of each of the dividing plates 51 and 52 and the inner surface of the connecting pipe 7. These small spaces form a gas flow passageway 55 along which gas 23 which has vaporized from freezing mixture 2 in the inner vessel 3 can flow. Alternatively, if desired, the outer edges of the dividing plates 51 and 52 can be made to contact the inner surface of the connecting pipe 7, and a gas flow passageway 55 can be formed by cutting holes in the dividing plates 51 and 52, thereby allowing gas to flow therethrough.

The injection pipe 40 further comprises a low-temperature pipe 43 which extends through the center of the first inner pipe 41 to near the joint between the first inner pipe 41 and the second inner pipe 42. When freezing mixture 2 is supplied to the inner vessel 3, it is passed through this low-temperature pipe 43 into the second inner pipe 42, and from there into the inner vessel 3. To prevent freezing mixture 2 which flows backwards along the space between the first inner pipe 41 and the low-temperature pipe 43 from leaking to the outside, a seal 54 is provided at the outer end of the low-temperature pipe 43.

The connecting pipe 7 has an upwards-extending branch pipe 20 formed on its outer end, and a rupture-type safety valve 8 is installed in this branch pipe 20. A gas by-pass 53 connects the outer end of the connecting pipe 7 with the branch pipe 20 on the atmospheric side of the safety valve 8 so that gas can flow along the gas flow passageway 55 and escape into the atmosphere when the safety valve 8 is intact.

The injection pipe 40 and the dividing plates 51 and 52 together constitute means for cooling the connecting pipe 7. The injection pipe 40, the spacer tubes 50, and the dividing plates 51 and 52 can be made from a variety of materials including stainless steel, aluminum, epoxy-glass laminates, and polytetrafluorethylene.

When the superconducting magnet 1 is operating normally, i.e., when it is in a superconducting state, a portion of the cryogenic mixture 2 is vaporized by a tiny amount of heat which manages to penetrate into the inner vessel 3. The resulting gas continually flows into the inlet 22 of the connecting pipe 7 and passes along the gas flow passageway 55 which is formed by the spaces between the outer ends of the dividing plates 51 and 52 and the inner surface of the connecting pipe 7. As in the previous embodiment, the gas is extremely cold (approximately 4.2 K when the cryogenic mixture is liquid helium) when it enters the inlet 22 of the connecting pipe 7, and it absorbs heat which is conducted by the connecting pipe 7 from its outer end. At the same time, the gas cools the injection pipe 40 and greatly reduces the amount of heat which penetrates into the inner vessel 3 by conduction along the injection pipe 40. When the gas reaches the outer end of the gas flow passageway 55, it flows through the by-pass 53 and is discharged into the atmosphere.

If for some reason the superconducting magnet 1 should malfunction and go into a non-critical state, a large quantity of gas will be formed by the vaporization of the mixture 2. When the pressure of this gas reaches a certain level, the gas will rupture or elastically deform and push open the dividing plates 51 and 52, rupture the safety valve 8, and be discharged into the atmosphere, reducing the pressure inside the internal vessel 3 and preventing its damage.

Like the previous embodiment, this embodiment provides the advantages that the vessel can be made compact due to the provision of the dividing pipe 21, penetration of heat by convection can be greatly reduced by the dividing plates 51 and 52, and the penetration of heat by conduction along the connecting pipe 7 can also be greatly reduced. It provides the further advantages that penetration of heat by conduction along the injection pipe 40 can be restricted and that replenishment of freezing mixture 2 can be performed while the superconducting magnet 1 is in operation.

Figure 10:
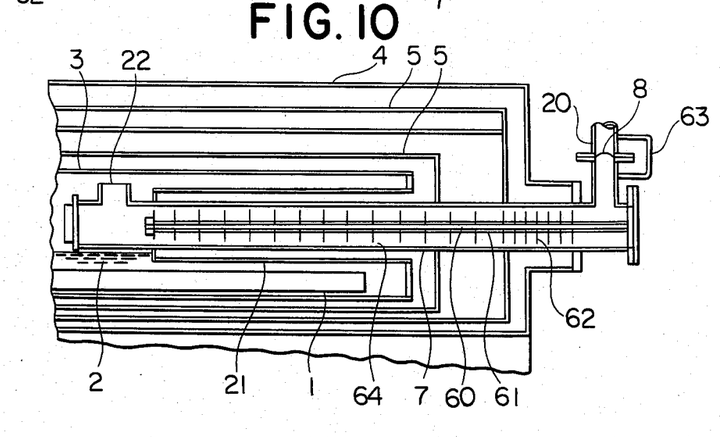
FIG. 10 is longitudinal cross-sectional view of a portion of a fourth embodiment of a cryogenic vessel.

FIG. 10 shows the essential features of a fourth embodiment of a cryogenic vessel according to the present invention. The structure is similar to that of the previous embodiment, but instead of an injection pipe 40, a support rod 60 is provided inside a connecting pipe 7. The outer end of the support rod 60 is secured to the outer end of the connecting pipe 7, and the inner end of the support rod 60 extends to the vicinity of the inlet 22 of the connecting pipe 7. The support rod 60 supports a plurality of disk-shaped dividing plates 62 which serve the same purpose as the dividing plates of the previous embodiments. The dividing plates 62 are held in place by spacer tubes 61 which fit over the support rod 60 and maintain the proper spacing between adjacent dividing plates 62. As in the previous embodiment, a gap is provided between the outer surface of each of the dividing plates 62 and the inner surface of the connecting pipe 7 so that a gas flow passageway 64 is formed along the length of the connecting pipe 7. Alternatively, the dividing plates 62 can be made such that their outer surfaces contact the inner surface of the connecting pipe 7, and a gas flow passageway 64 can be formed by cutting holes in the dividing plates 62. The support rod 60 and the dividing plates 62 together constitute means for cooling the connecting pipe 7.

As in the previous embodiment, the connecting pipe 7 has an upwards-extending branch pipe 20 formed thereon in which is installed a rupture-type safety valve 8. A by-pass 63 connects the inner side of the branch pipe 20 with the atmospheric side so that gas which passes through the gas flow passageway 64 can bypass the safety valve 8 and be discharged into the atmosphere. The structure of this embodiment, including that of the unillustrated portions, is otherwise identical to that of the previous embodiment.

As in the previous embodiment, gas which is formed by the vaporization of a portion of the freezing mixture 2 during the normal operation of the superconducting magnet 1 enters the inlet 22 of the connecting pipe 7 and continually flows along the gas flow passageway 64, absorbing heat from the connecting pipe 7 as it flows and restricting the amount of heat which penetrates by conduction along the connecting pipe 7. Upon reaching the end of the connecting pipe 7, the gas is discharged into the atmosphere via the by-pass 63. Furthermore, the dividing plates 62 restrict convection by gas within the connecting pipe 7, and the penetration of heat into the inner vessel 3 by both conduction and convection is reduced.

Figure 11:
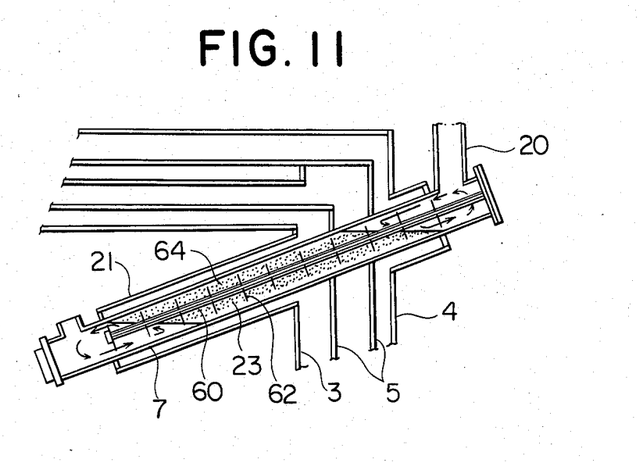
FIG. 11 is a longitudinal cross-sectional view of a portion of a fifth embodiment of a cryogenic vessel in which the connecting pipe is disposed at an angle with respect to the horizontal.

FIG. 11 illustrates a fifth embodiment of a cryogenic vessel according to the present invention. The embodiment has basically the same structure as that of the previous embodiment, but whereas in the previous embodiment the dividing pipe 21, the connecting pipe 7, and the support rod 60 were substantially horizontal, in this embodiment they are each disposed at an angle of 20 degrees with respect to the horizontal. By sloping these members at angle of approximately 10-20 degrees, the penetration of heat into the inner vessel 3 along the connecting pipe 7 is decreased for the reason that in this case convection does not take place along a portion of the connecting pipe 7. If the dividing plates 62 are made of a material having good thermal conductivity such as metal, heat will flow inside the dividing plates 62 from top to bottom and again produce convection. However, this can be prevented if the dividing plates 62 are made from a substance having poor thermal conductivity such as a foamed material.

Figure 12:
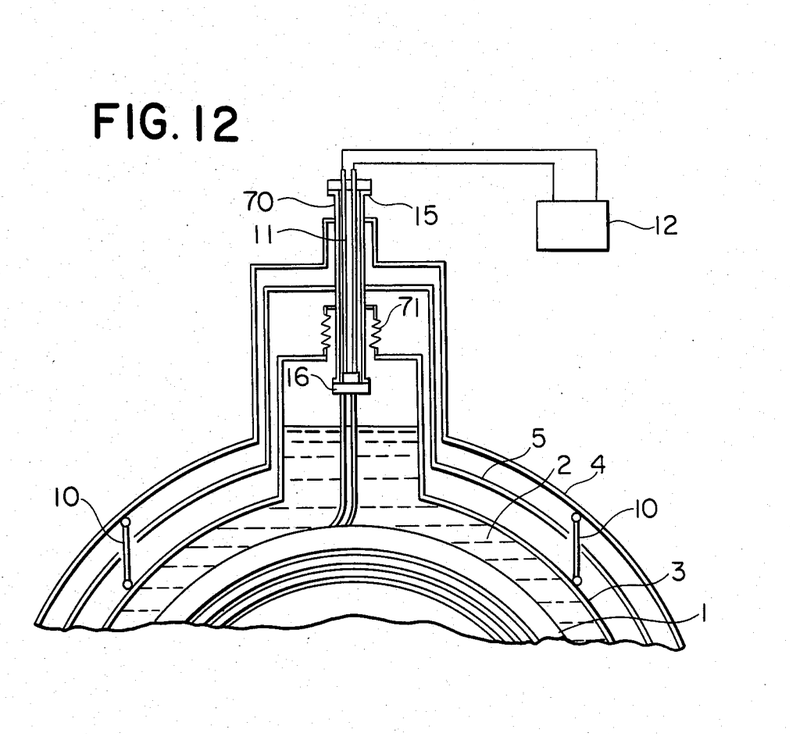
FIG. 12 is a transverse cross-sectional view of a portion of a sixth embodiment of a cryogenic vessel.

FIG. 12 illustrates the essential features of a sixth embodiment of a cryogenic vessel according to the present invention. Those portions of the vessel not shown in this figure can be the same as those of any one of the previous embodiments. This figure shows the portion of a cryogenic vessel which is penetrated by power supply leads 11. The power supply leads 11 are housed inside a wiring support pipe 70 having a flange 15 formed at its upper end to which the upper ends of the power supply leads 11 are secured, and having a connector 16 installed at its bottom end by means of which the power supply leads 11 are electrically connected to a superconducting magnet 1 housed within an inner vessel 3. The inner vessel 3 is supported by a vacuum insulating vessel 4 through supporting members 10. Whereas in the conventional apparatus of FIG. 3 the wiring support pipe 13 comprises separate upper and lower portions connected by a flexible tube 14, in the present embodiment, the wiring support pipe 70 is a single, rigid pipe. The wiring support pipe 70 is rigidly secured near its upper end to the outer surface of the vacuum insulating vessel 4. Its midportion is connected to the outer surface of the inner vessel 3 by a flexible tube 71 which projects outwards from the inner vessel 3.

With this construction, the inner vessel 3 is able to freely move with respect to the wiring support tube 70 so that when the supporting members 10 or the inner vessel 3 undergoes thermal shrinkage, the change in dimensions of the inner vessel 3 has no effect on the wiring support pipe 70 or the power supply leads 11.

When the inside of the cryogenic vessel is cooled, the wiring support pipe 70 and the power supply leads 11 also undergo thermal shrinkage, but as they have approximately the same coefficient of thermal expansion, they undergo approximately the same amount of shrinkage, and no significant thermal stresses are induced therein. Accordingly, the present embodiment overcomes the problem of the conventional cryogenic vessel of FIG. 3 in which thermal stresses develop in the power supply leads 11, making it difficult to achieve a good connection between the power supply leads 11 and the connector 16.

Figure 13:
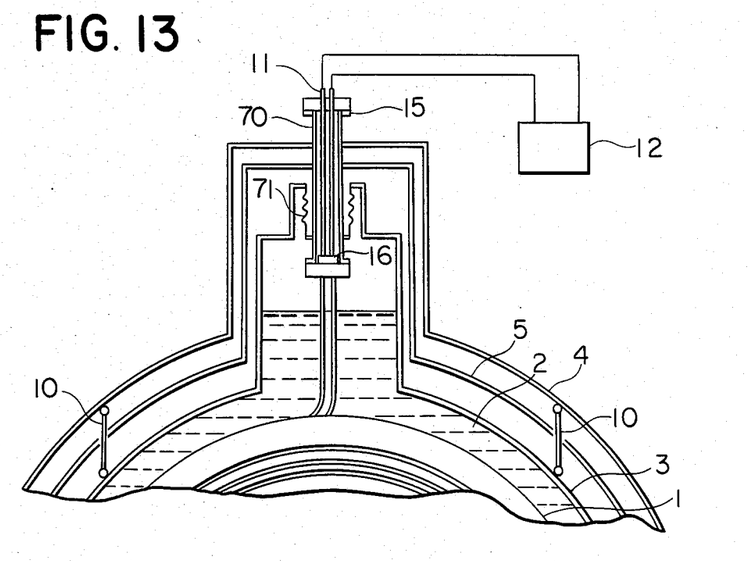
FIG. 13 is a transverse cross-sectional view of a portion of a seventh embodiment of a cryogenic vessel.

FIG. 13 illustrates a seventh embodiment of the present invention which differs from the previous embodiment only in that the flexible tube 71 is disposed inside the inner vessel 3, extending inwards from the outer surface of the inner vessel 3 and connecting to the wiring support pipe 70 near its inner end. The effects provided by this embodiment are the same as those of the previous embodiment.

Figure 14:
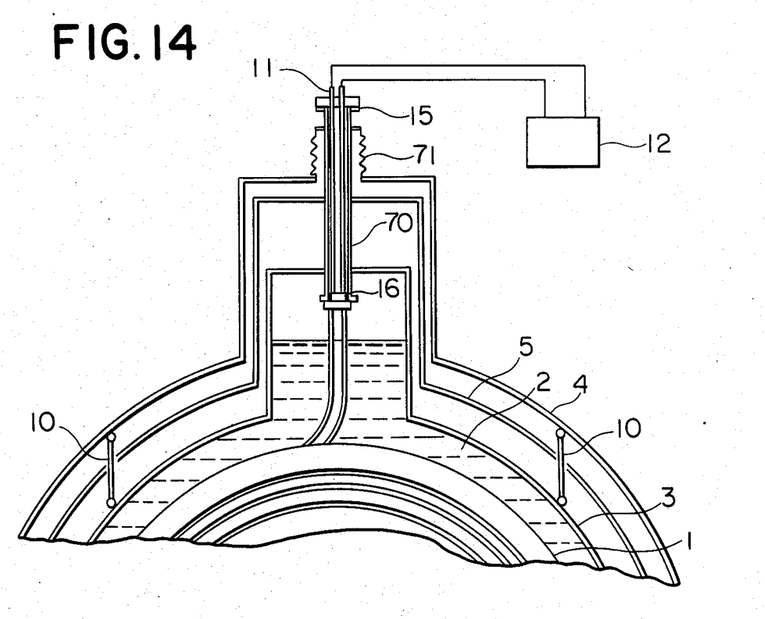
FIG. 14 is a transverse cross-sectional view of a portion of an eighth embodiment of a cryogenic vessel.

In the previous two embodiments, the outer end of a rigid wiring support pipe 70 is rigidly secured to the outer surface of a vacuum insulating vessel 4 and the inner end of the wiring support pipe 70 is connected to an inner vessel 3 through a flexible tube 71. FIG. 14 illustrates an eighth embodiment of the present invention in which the manner of connection is reversed. Namely, the inner end of a wiring support pipe 70 is rigidly connected to an inner vessel 3, and the outer end of the wiring support pipe is connected to a vacuum insulating vessel 4 through a flexible tube 71 which projects outwards from the vacuum insulating vessel 4. The effects are identical to those of the previous two embodiments.

Figure 15:
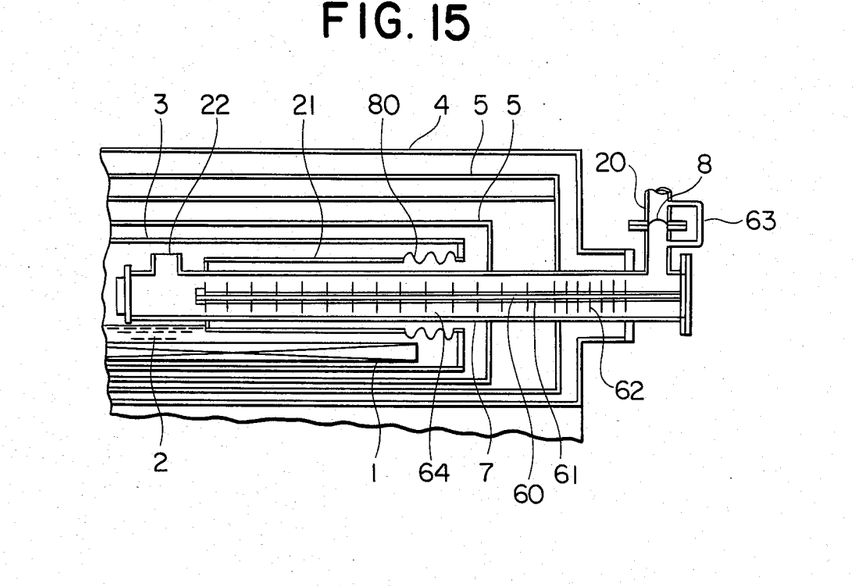
FIG. 15 is a longitudinal cross-sectional view of a portion of a ninth embodiment of a cryogenic vessel.
Figure 16:
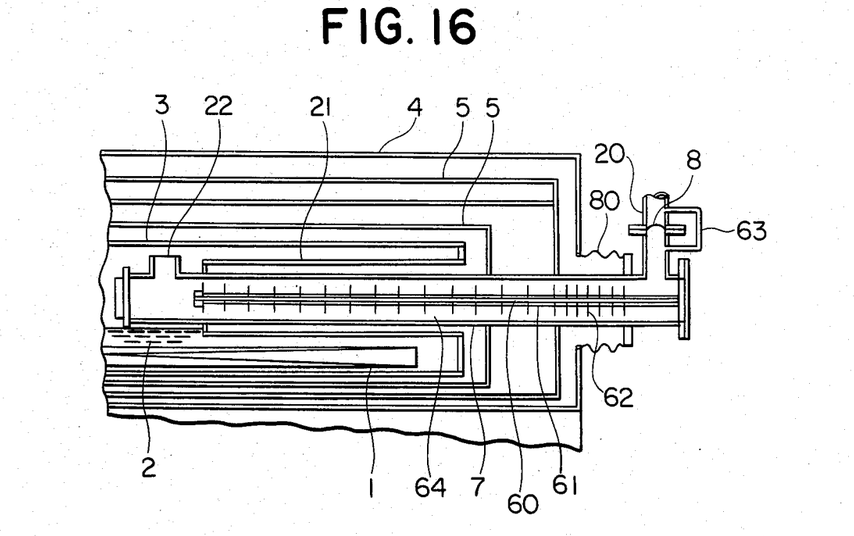
FIG. 16 is a longitudinal cross-sectional view of a portion of a tenth embodiment of a cryogenic vessel.

In each of the previous embodiments, the inner end of a connecting pipe 7 is rigidly secured to an inner vessel 3 through a dividing pipe 21, and the outer end of the connecting pipe 7 is rigidly secured to a vacuum insulating vessel 4. However, as shown in FIGS. 15 and 16 it is possible to connect the connecting pipe 7 to the inner vessel 3 or the vacuum insulating vessel 4 in an elastic manner so that thermal shrinkage can be compensated for without producing thermal stresses in the connecting pipe 7. FIG. 15 shows a ninth embodiment of the present invention in which a flexible tube 80 is provided between the outer end of the dividing pipe 21 and the surface of the inner vessel 3. Furthermore, FIG. 16 shows a tenth embodiment of the present invention in which an outwards-projecting flexible tube 80 is connected between the outer end of the connecting pipe 7 and the outer surface of the vacuum insulating vessel 4. These two embodiments are otherwise identical to the embodiment of FIG. 10, and the same effects as in that embodiment are achieved. In the same manner, a flexible tube 80 can be employed between the dividing pipe 21 and the inner vessel 3, or between the connecting pipe 7 and the vacuum insulating vessel 4 of a cryogenic vessel having the structure of any one of the other previously-described embodiments.

Figure 17:
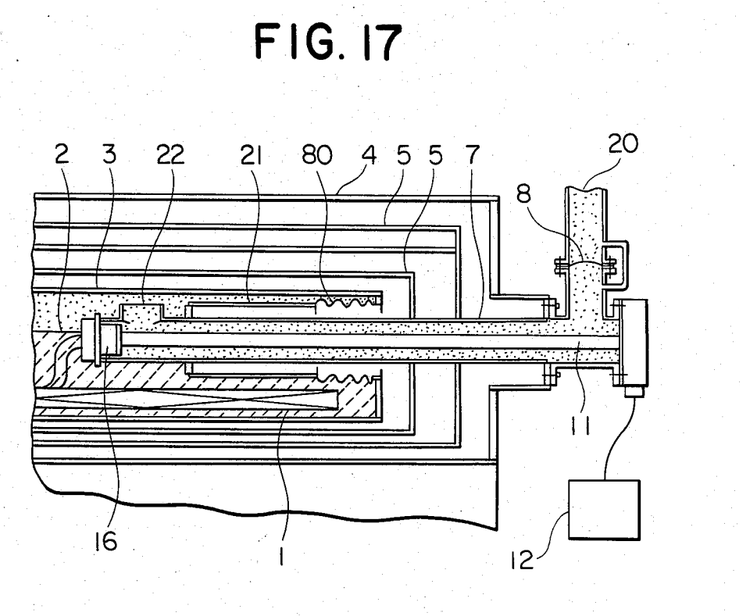
FIG. 17 is a longitudinal cross-sectional view of a portion of an eleventh embodiment of a cryogenic vessel.

FIG. 17 shows an eleventh embodiment of a cryogenic vessel according to the present invention in which a connecting pipe 7 serves not only as a means for discharging gas into the atmosphere but also as a support for the power supply leads 11 for a superconducting magnet 1. Power supply leads 11 extend from the outer end of the connecting pipe 7, where they are electrically connected to a power supply 12, to the inner end of the connecting pipe 7, where they are connected to a connector 16 which is electrically connected to the superconducting magnet 1. In order to prevent thermal stresses from developing in the power supply leads 11, a dividing pipe 21 is connected to the surface of an inner vessel 3 by a flexible tube 80 which compensates for any thermal shrinkage. Alternatively, the flexible tube 80 can be used to connect the outer surface of the vacuum insulating vessel 4 to the outer end of the connecting pipe 7, in a manner similar to that shown in FIG. 16. The structure is otherwise identical to that of the embodiment of FIG. 4. By installing the power supply leads 11 inside the connecting pipe 7, a separate wiring support pipe 70 as in FIG. 12 is made unnecessary, and the vessel can be made more compact.

In each of the previous embodiments, the cryogenic vessel houses a superconducting magnet 1, but the present invention is not limited to use with a magnet, and it can also be used to house the windings of other types of superconducting devices.

What is claimed is:
1. A cryogenic vessel for superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical outer vessel surrounding said inner vessel and providing a vacuum-insulating space between said vessels for thermal insulation;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said outer vessel, the inner end of said connecting pipe being connected to the inner end of said dividing pipe and the radial clearance being in communication with the vacuum-insulating space; and a rupture-type safety valve disposed at one of the ends of said connecting pipe.

2. A cryogenic vessel as claimed in claim 1 further comprising cooling means for cooling said connecting pipe by continually passing gas which has formed by the vaporization of said cryogenic mixture along the surface of said connecting pipe.

3. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical vacuum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;

a rupture-type safety valve disposed at one of the ends of said connecting pipe; and said cooling means including;

a cylindrical inner pipe disposed inside said connecting pipe with a radial clearance therebetween and extending for substantially the entire length of said connecting pipe;

a spiral-shaped member wound around and projecting from said inner pipe to contact the outer surface of said inner pipe and the inner surface of said connecting pipe along the entire length of said spiral-shaped member, thereby forming a spiral-shaped gas flow passageway between said inner pipe and said connecting pipe, said gas flow passageway opening into the inside of said inner vessel at its inner end and into the outside of said vacuum insulating vessel at its outer end; and a plurality of disk-shaped dividing plates having substantially the same diameter as the inner diameter of said inner pipe, said dividing plates being disposed inside said inner pipe so as to divide the inside of said inner pipe into a plurality of small compartments, each of said dividing plates being made of a material having a low thermal conductivity, said rupture-type safety valve being installed on one of the ends of said inner pipe so as to seal said end of said inner pipe without obstructing said gas flow passageway.

4. A cryogenic vessel as claimed in claim 3, wherein each of said dividing plates has a pressure-equalizing hole formed therein.

5. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an nner end extending into said inner vessel;

a cylindrical vacuum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;

a rupture-type safety valve disposed at one of the ends of said connecting pipe; and said cooling means comprising:

a rod extending into said connecting pipe for substantially the entire length of said connecting pipe and supported by the outer end of said connecting pipe;

a plurality of disk-shaped dividing plates secured to said rod, each of said dividing plates being made of a material with a low thermal conductivity, the diameter of each of said dividing plates being smaller than the inner diameter of said connecting pipe so that a gas flow passageway is formed between the outer surfaces of said dividing plates and the inner surface of said connecting pipe.

6. A cryogenic vessel as claimed in claim 5 wherein:

said connecting pipe is disposed at an angle of approximately 10–20 degrees with respect to the horizontal.

7. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical vacuum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;

a rupture-type safety valve disposed at one of the ends of said connecting pipe; and said cooling means comprising:

a pipe for injection of cryogenic mixture disposed inside said connecting pipe, the inner end of said pipe for injection extending into said inner vessel and the outer end of said pipe for injection extending to the outside of said connecting pipe; and a plurality of disk-shaped dividing plates mounted on said connecting pipe and dividing the inside of said connecting pipe in the longitudinal direction into a plurality of small compartments, each of said dividing plates being made of a material having a low thermal conductivity, the outer diameter of each of said dividing plates being smaller than the inner diameter of said connecting pipe so that a gas flow passageway is formed between the outer surface of said dividing plates and the inner surface of said connecting pipe.

8. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical vacuum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;

a rupture-type safety valve disposed at one of the ends of said connecting pipe; and a power supply lead for said superconducting winding;

a rigid wiring support pipe surrounding said power supply lead and penetrating said inner vessel and said vacuum insulating vessel; and a flexible tube, the outer end of said wiring support pipe being connected to said vacuum insulating vessel by said flexible tube and the inner end of said wiring support pipe being rigifly connected to said inner vessel.

9. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical vacuum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;

a rupture-type safety valve disposed at one of the ends of said conducting pipe; and a power supply lead for said superconducting winding;

a rigid wiring support pipe surrounding and supporting said power supply lead penetrating said inner vessel and said vacuum insulating vessel; and a flexible tube, the inner end of said wiring support pipe being connected to said inner vessel by said flexible tube and the outer end of said wiring support pipe being rigidly connected to said vacuum insulating vessel.

10. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical vacuum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;

a rupture-type safety valve disposed at one of the ends of said connecting pipe; and a flexible tube connected between said dividing pipe and said inner vessel so as to enable said dividing pipe to move in its axial direction.

11. A cryogenic vessel as claimed in claim 10 further comprising:

a power supply lead for said superconducting winding:

a rigid wiring support pipe surrounding said power supply lead penetrating said inner vessel and said vacuum insulating vessel; and a flexible tube, the outer end of said wiring support pipe being connected to said vacuum insulating vessel by said flexible tube and the inner end of said wiring support pipe being rigidly connected to said inner vessel.

12. A cryogenic vessel as claimed in claim 10 further comprising:

a power supply lead for said superconducting winding:

a rigid wiring support pipe surrounding and supporting said power supply lead penetrating said inner vessel and said vacuum insulating vessel; and a flexible tube, the inner end of said wiring support pipe being connected to said inner vessel by said flexible tube and the outer end of said wiring support pipe being rigidly connected to said vacuum insulating vessel.

13. A cryogenic vessel for a superconducting apparatus comprising:

a cylindrical inner vessel for containing a superconducting winding of a superconducting device and a cryogenic mixture;

a cylindrical dividing pipe having an outer end secured to an outer surface of said inner vessel and an inner end extending into said inner vessel;

a cylindrical vaccum insulating vessel surrounding said inner vessel so as to thermally insulate it;

a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulting vessel, the inner end of said connecting pipe being connected to the inner end of said dividing pipe;

a rupture-type safety valve disposed at one of the ends of said connecting pipe; and a flexible tube connected between the outer end of said connecting pipe and said vacuum insulating vessel.

14. A cryogenic vessel as claimed in claim 13 further comprising:
a power supply lead for said superconducting winding:
a rigid wiring support pipe surrounding said power supply lead penetrating said inner vessel and said vacuum insulating vessel; and
a flexible tube, the outer end of said wiring support pipe being connected to said vacuum insulating vessel by said flexible tube and the inner end of said wiring support pipe being rigidly connected to said inner vessel.

15. A cryogenic vessel as claimed in claim 13 further comprising:
a power supply lead for said superconducting winding:
a rigid wiring support pipe surrounding and supporting said power supply lead penetrating said inner vessel and said vacuum insulating vessel; and
a flexible tube, the inner end of said wiring support pipe being connected to said inner vessel by said flexible tube and the outer end of said wiring support pipe being rigidly connected to said vacuum insulating vessel.

16. A cryogenic vessel for a supeconducting apparatus comprising:
a cylindrical inner vessel for containing a supeconducting winding of a superconducting device and a cryogenic mixture;
a cylindrial dividing pipe having an outer end secured to an outer surface of said inner vessel and an inner end extending into said inner vessel;
a cylindrical vacuum insulating vessel surrounding said inner vessel so as to thermally insulate it;
a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe;
a rupture-type safety valve disposed at one of the ends of said connecting pipe; and
a power supply lead for said superconducting winding dsiposed inside and supported by said connecting pipe; and
a flexible tube connected between said dividing pipe and said inner vessel so as to enable said dividing pipe to move in its axial direction.

17. A cryogenic vessel for a superconducting apparatus comprising:

a cylindrical inner vessel for containing a superconducting winding of a superconducting device and a cryogenic mixture;
a cylindrical dividing pipe having an outer end secured to an outer surface of said inner vessel and an inner end extending into said inner vessel;
a cylindrical vacuum insulating vessel surrounding said inner vessel so as to thermally insulate it;
a connecting pipe extending into said inner vessel along the inside of said dividing pipe with a radial clearance between the outer surface of said connecting pipe and the inner surface of said dividing pipe and having an inner end opening into the outside of said vacuum insulating vessel, the inner end of said connecting pipe being connected to the inner end of said dividing pipe;
a rupture-type safety valve disposed at one of the ends of said connecting pipe; and
a power supply lead for said superconducting winding disposed inside and supported by said connecting pipe; and
a flexible tube connected between the outer end of said connecting pipe and said vacuum insulating vessel.

18. A cryogenic vessel for a superconducting apparatus comprising:
a cylindrical inner vessel for containing a superconducting winding of a superconducting device and a cryogenic mixture;
a cylindrical dividing pipe having an outer end secured to an outer surface of said inner vessel and an inner end extending into said inner vessel;
a cylindrical vacuum insulating vessel surrounding said inner vessel so as to thermally insulate it;
a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe; and
said cooling means comprising:
a rod exending into said connecting pipe for substantially the entire length of said connecting pipe and supported by the outer end of said connecting pipe;
a plurality of disk-shaped dividing plates secured to said rod, each of said dividing plates being made of a material with a low thermal conductivity, the diameter of each of said dividing plates being smaller than the inner diameter of said connecting pipe so that a gas flow passageway is formed between the outer surfaces of said dividing plates and the inner surface of said connecting pipe.

19. A cryogenic vessel for a superconducting apparatus comprising:
a cylindrical inner vessel for containing a superconducting winding of a superconducting device and a cryogenic mixture;
a cylindrical dividing pipe having an outer end secured to an outer surface of said inner vessel and an inner end extending into said inner vessel;
a cylindrical vaccum insulating vessel surrounding said inner vessel so as to thermally insulate it;
a connecting pipe extending into said inner vessel along the inside of said dividing pipe with a radial clearance between the outer surface of said connecting pipe and the inner surface of said dividing pipe and having an inner end opening into the inside of said inner vessel and an outer end opening into the outside of said vacuum insulating vessel, the inner end of said connecting pipe being connected to the inner end of said dividing pipe; and said cooling means comprising:

a pipe of injection of cryogenic mixture disposed inside said connecting pipe, the inner end of said pipe for injection extending into said inner vessel and the outer end of said pipe for injection extending to the outside of said connecting pipe; and;

a plurality of disk-shaped dividing plates mounted on said connecting pipe and dividing the inside of said connecting pipe in the longitudinal direction into a plurality of small compartments, each of said dividing plates being made of a material having a low thermal conductivity, the outer diameter of each of said dividing plates being smaller than the inner diameter of said connecting pipe so that a gas flow passageway is formed between the outer surface of said dividing plates and the inner surface of said connecting pipe.

* * * * *